United States Patent
Kelly et al.

(10) Patent No.: US 7,190,175 B1
(45) Date of Patent: Mar. 13, 2007

(54) ORTHOGONAL MICROWAVE IMAGING PROBE

(75) Inventors: Michael Kelly, Portola Valley, CA (US); Zhengyu Wang, Stanford, CA (US); Zhi-Xun Shen, Stanford, CA (US)

(73) Assignee: Stanford University, Stanford, CA (US)

( * ) Notice: Subject to any disclaimer, the term of this patent is extended or adjusted under 35 U.S.C. 154(b) by 0 days.

(21) Appl. No.: 11/139,759

(22) Filed: May 27, 2005

(51) Int. Cl.
*G01R 27/04* (2006.01)
*G01R 31/02* (2006.01)
*G01N 23/00* (2006.01)

(52) U.S. Cl. .................. 324/637; 324/72.5; 250/311; 250/310

(58) Field of Classification Search ............. 324/637, 324/72.5; 250/311, 310
See application file for complete search history.

(56) References Cited

U.S. PATENT DOCUMENTS

| | | | |
|---|---|---|---|
| 4,481,616 A | 11/1984 | Matey | 369/53.41 |
| 5,065,103 A | 11/1991 | Slinkman et al. | 324/458 |
| 5,523,700 A | 6/1996 | Williams et al. | 324/765 |
| 5,744,704 A * | 4/1998 | Hu et al. | 73/105 |
| 5,821,410 A | 10/1998 | Xiang et al. | 73/105 |
| 5,866,904 A * | 2/1999 | Todokoro et al. | 250/310 |
| 5,900,618 A | 5/1999 | Anlage et al. | 250/201.3 |
| 6,320,688 B1 * | 11/2001 | Westbrook et al. | 398/194 |
| 6,597,185 B1 * | 7/2003 | Talanov et al. | 324/638 |
| 6,614,227 B2 * | 9/2003 | Ookubo | 324/316 |
| 6,825,645 B2 | 11/2004 | Kelly et al. | 324/72.5 |
| 6,856,140 B2 * | 2/2005 | Talanov et al. | 324/638 |
| 7,109,735 B1 * | 9/2006 | Janik et al. | 324/763 |
| 2003/0071605 A1 * | 4/2003 | Kelly et al. | 324/72.5 |
| 2006/0176062 A1 * | 8/2006 | Yang et al. | 324/663 |

* cited by examiner

*Primary Examiner*—Andrew H. Hirshfeld
*Assistant Examiner*—Jeff Natalini
(74) *Attorney, Agent, or Firm*—Charles S. Guenzer

(57) ABSTRACT

A microwave imaging microscope and associated probe, or a read head. The probe or the read head includes a sensor unit with three fixed electrodes, preferably a stimulating electrode surrounding a sensing electrode and isolated by a grounded electrode. Circuitry couples the stimulating electrode to the probe signal variably selected in the range of 100 MHz to 100 GHz and couples the sensing electrode to a signal processor detecting in-phase and out-of-phase components of the current or voltage across the sensing electrode and the grounded electrode. A mechanical positioner moves the probe vertically towards the sample and scans it across the sample. The probe may be formed by semiconductor processing methods on a silicon chip.

19 Claims, 5 Drawing Sheets

ORTHOGONAL MICROWAVE IMAGING PROBE

FIELD OF THE INVENTION

The invention relates generally to electromagnetic measuring equipment and methods. In particular, the invention relates to a high-frequency probe used for mapping dielectric constant, resistivity and other electromagnetic characteristics in a sample with resolution of substantially less than a millimeter.

BACKGROUND ART

There is much interest in developing a microwave microscope that can measure one or more electrical characteristics of a sample in the gigahertz range and, by scanning the probe over the sample surface, to image the spatial variation of such characteristics. Such a microwave microscope would be very useful in the semiconductor industry for mapping resistivity and dielectric constant over the wafer, particularly during its fabrication since a microwave measurement can be non-destructive. In some instances, the thickness of a layer may be related to such electrical characteristics. The gigahertz measurement frequency corresponds to the important frequencies utilized in semiconductor devices. The probe of such a microwave microscope can also be used as a read head for nano-scale information storage on ferroelectric recording medium.

For integrated circuits, the imaging resolution must be on the order of less than a few microns since feature sizes are being pushed to much less. However, microwave wavelengths and waveguide dimensions are in the range of centimeters to millimeters, far greater than the desired resolution.

Several proposals have been made for microwave probes that have a spatial resolution much less than the wavelength of the radiation being used, using a technique called near-field. This technique allows spatial resolution less than the wavelength being used by scanning a probe very close to a sample. For example, Xiang et al. in U.S. Pat. No. 5,821,410 describe a sharpened probe tip extending through an aperture in a resonant quarter-wavelength cavity and projecting toward the sample under test. Anlage et al. in U.S. Pat. No. 5,900,618 disclose a somewhat similar microwave microscope.

Somewhat similar measurements can be made using a scanning capacitor measurement apparatus with a small tip electrode and the sample acting as the other electrode, such as disclosed by Williams et al. in U.S. Pat. No. 5,523,700, by Slinkman et al. in U.S. Pat. No. 5,065,103, and by Matey in U.S. Pat. No. 5,581,616 and reissued U.S. Pat. Re. 32,457. Calculations relate the measured capacitance some measurement parameters such as DC voltage with electrical characteristics of the material. This design is a non-resonant structure, thus can have a broad bandwidth of operation. The sense area of these designs however extends far from the probe electrode, and it is difficult to relate the measured impedance to the dielectric constant and resistivity of the material.

Kelly et al. in U.S. Pat. No. 6,825,645, incorporated herein by reference, discloses a microwave imager, which utilizes a non-resonant structure to gain a broad bandwidth of operation and further puts a grounded electrode next to the sensing electrode, which avoids the problem of a large sense area.

These proposals, whether using a resonant structure or a non-resonant structure, all depend upon a single electrode to stimulate the sample and to sense the electrical potential change on the sample surface. Thus, there is often a large reflected excitation signal on the electrode which has not interacted with the sample and which is larger than the sensed signal which has interacted. The reflected signal may exist exists even when no sample is present. This reflected signal is referred to as the common mode signal. In an attempt to detect a small signal emitted from a sample by amplifying the signal from the probe, the common mode signal can easily saturate a detector. A common mode cancellation circuitry can be used to cancel the common mode signal. However, such a circuitry is not always stable, and it adds another source of shot noise to the original shot noise in the common mode signal.

SUMMARY OF THE INVENTION

A microwave microscope may be scanned over a sample surface to image electromagnetic characteristics of the sample, thereby allowing sample characterization at a fixed frequency in the range of 100 MHz to 100 GHz, more preferably 500 MHz to 5 GHz, for example, 1 GHz. The microscope uses a probe and a circuitry.

The probe preferably includes a stimulating electrode to excite the sample, and a separate sensing electrode to sense the surface potential change. Preferably, the stimulating electrode surrounds the sensing electrode. The sensing electrode may have a sharpened tip to improve spatial resolution. The probe may also include an isolating electrode located between the stimulating electrode and the sensing electrodes.

Alternatively, such a probe may be used as a read head for nano-scale information storage on ferroelectrics recording medium.

The circuitry may include a detection circuit which compares the output signal from the sensing electrode with a reference signal from the microwave source to detect the in-phase and out-of-phase components of the output.

The probe may be formed by standard semiconductor techniques in a five layer structure deposited on a silicon chip. Three metal layers are separated by two dielectric layers. Microwave strip transmission lines may be formed in the top and bottom metal layers with the middle metal layer acting a ground.

DETAILED DESCRIPTION OF THE PREFERRED EMBODIMENTS

Figure 1:
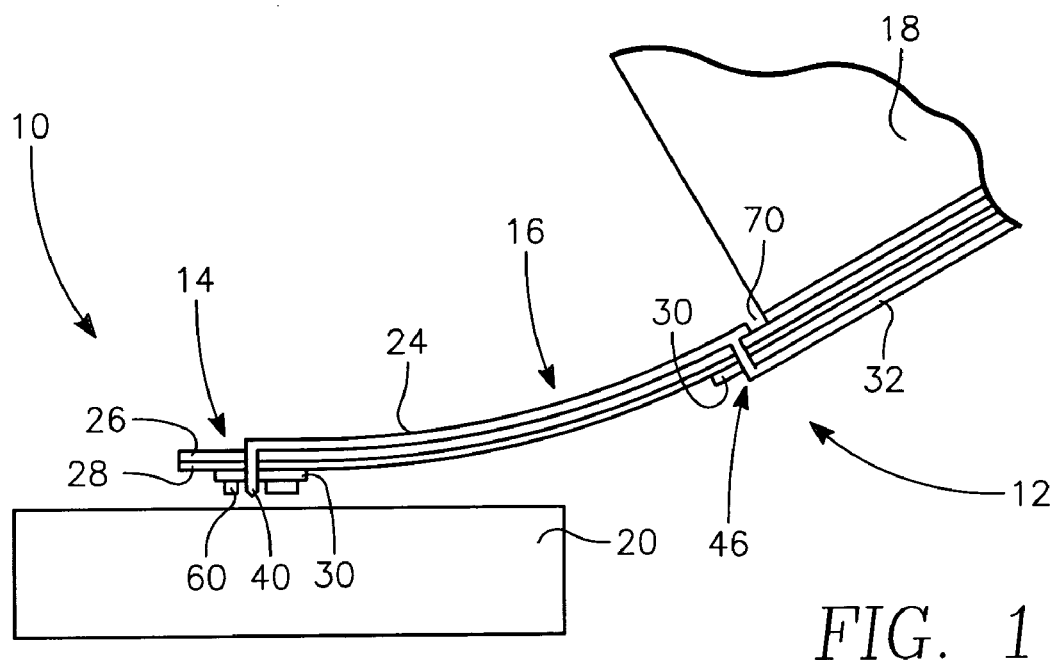
FIG. 1 is a bottom plan view of an embodiment of the microwave probe of the invention.
Figure 2:
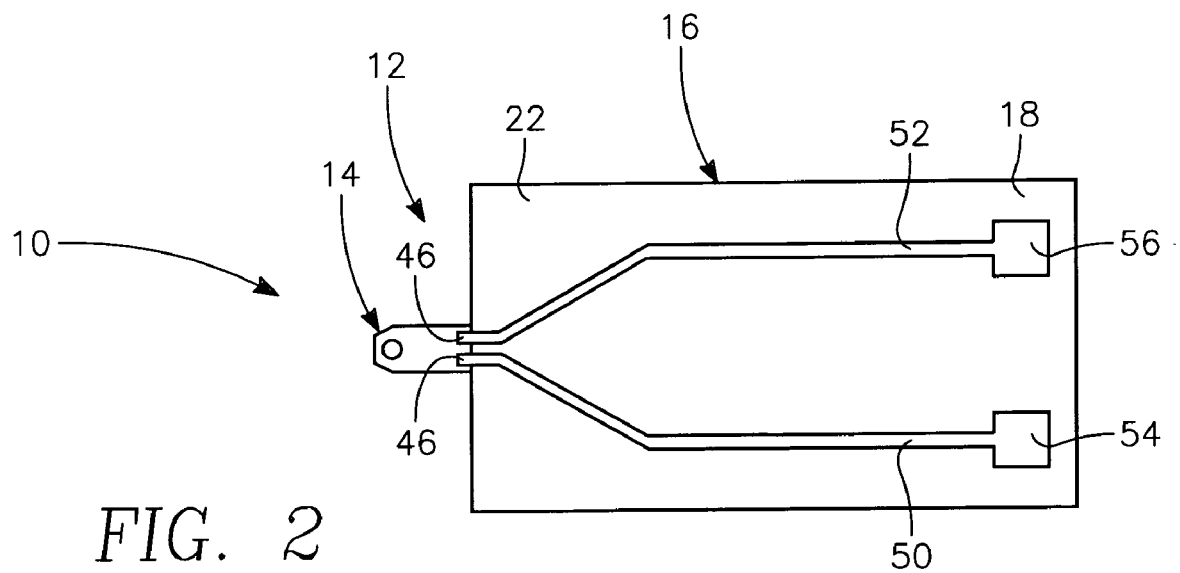
FIG. 2 is a cross-sectional view of the probe tip of the probe of FIG. 1 including the stimulating and sensing structures.
Figure 3:
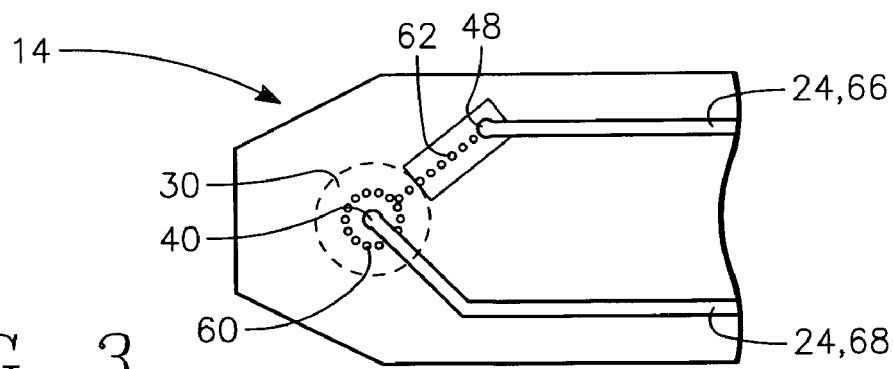
FIG. 3 is a schematic top view of the probe tip of FIG. 2.
Figure 4:
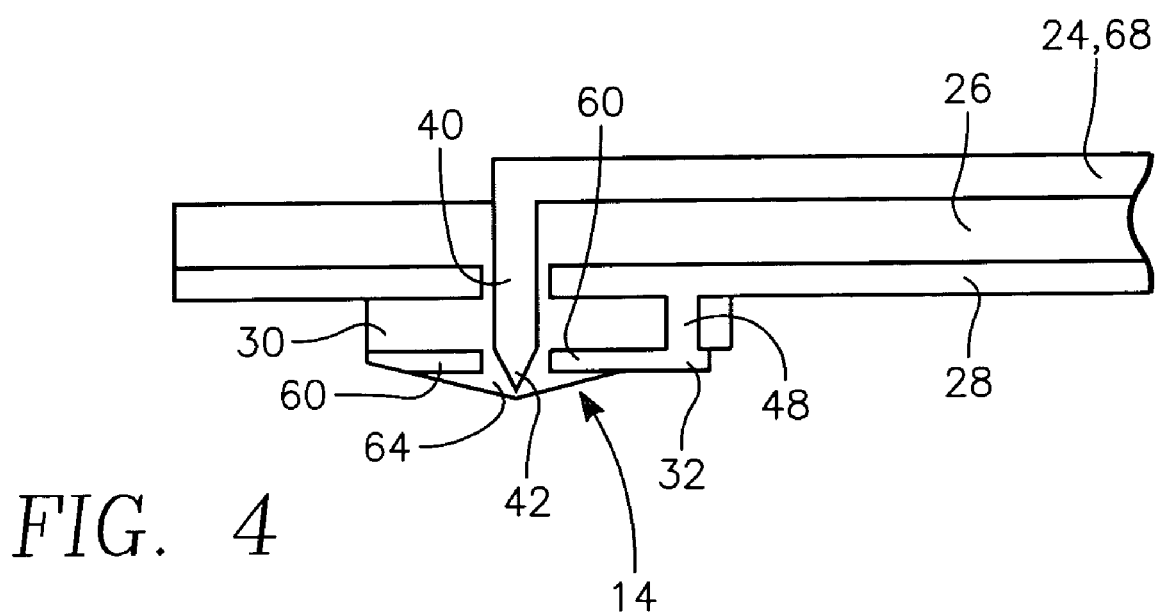
FIG. 4 is a cross-sectional view of the probe tip of FIG. 3.

An embodiment of the invention includes a probe 10 illustrated in the cross-sectional view of FIG. 1 and in the bottom plan view of FIG. 2, which is part of a probe assembly 12. A probe tip 14 at the distal end of a cantilever 16 supported on a mount 18 is scanned adjacent to a sample 20 being electrically characterized. The probe tip 14 is shown in more detail in the top plan view of FIG. 3 and the cross-sectional view of FIG. 4.

Figure 5:
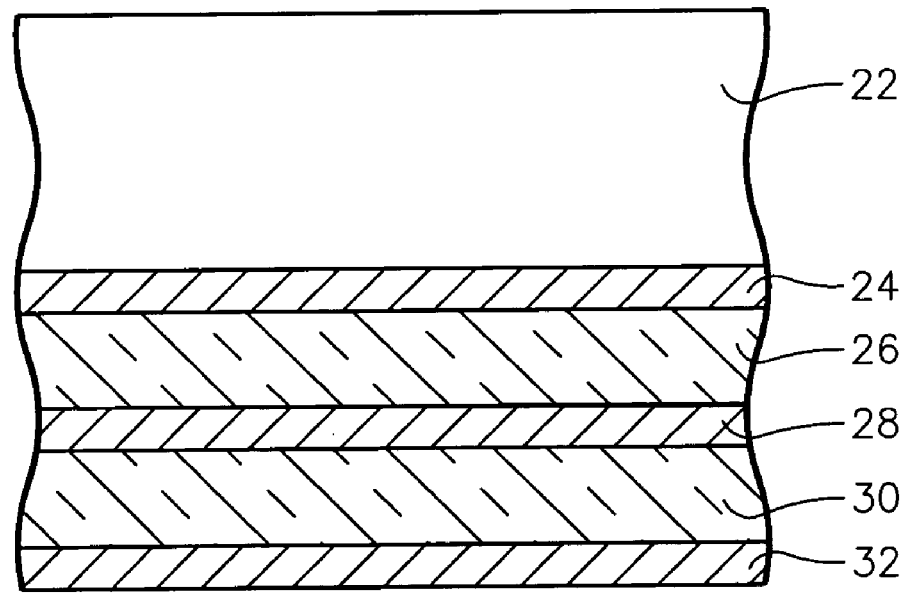
FIG. 5 is a cross-sectional view of as stack structure from which the probe assembly may be fabricated.

Although the more general aspects of the invention are not limited to its fabrication method, the probe 10 and the mount 18 may be formed from a silicon chip 22, illustrated in the cross-sectional view of FIG. 5 in an inverted orientation corresponding to its final usage. The fabrication steps follow those used in forming silicon integrated circuits and micro electromechanical system (MEMS) devices. The chip 22, which may have a size of approximately 2 mm×4 mm, may be developed as an array of replicated chips 22 on a silicon wafer according to standard semiconductor processing techniques. A vertical structure is formed on the chip to include a top metal layer 24, an upper dielectric layer 26, a middle metal layer 28, a lower dielectric layer 30, and a bottom metal layer 32. The top and bottom metal layers 24, 26 serve as transmission conductors and other purposes in opposition to the grounded middle metal layer 26 across the respective dielectric layers 26, 30. The metal layers 24, 28, 32 may be sputtered aluminum or aluminum alloy. The dielectric layers 26, 30 may be silicon dioxide or related silica compound deposited by chemical vapor deposition (CVD). Typical thickness of all layers 24, 26, 28, 30, 32 are between 2 and 5 μm although other thicknesses may be chosen. The dielectric thickness should be thick enough to electrically isolate the metal layers at microwave frequencies and to form a strip transmission line capacitively coupled between adjacent metal layers.

The chip 20 is lithographically etched from its illustrated bottom side to form an electrode via to the upper metal layer 24 and an inner electrode 40 is deposited within the via with dielectric isolation to the middle and bottom metal layers 28, 32 but with electrical contact to the upper metal layer 24. A tip 42 of the inner electrode 40 may be defined and sharpened by focused ion beam (FIB) milling to a radius of less than 10 μm, for example in a range of 5 to 500 nm, preferably less than 100 nm. Under the proper operating conditions, the size of the electrode tip 42 determines the resolution of the microwave microscope. The resolution is not limited by the much larger microwave wavelength. The resolution is improved by extending the electrode tip 42 to the level of the surrounding excitation electrode or beyond.

At the same time that the electrode via is being etched, two cross-connect vias 46 and an excitation cross-connect via 48 are etched from the bottom metal layer 32 to the top metal layer 24. Also, when the electrode 40 is being deposited, the cross-connects vias 46, 48 are filled with metal with adequate sidewall isolation to the middle metal layer 28 to electrically connect the top and bottom metal layers 24, 32 in the respective areas. The sidewall isolation for the inner electrode 40 and the three cross-connect vias 46, 48 can be achieved by patterning large vias in the middle metal layer 28 immediately following its deposition.

The bottom side (top as illustrated) of the chip 22 is lithographically processed to remove most of the bottom metal layer 32. The lithography leaves the cross-connect vias 46, 48 and their metallizations and also leaves under the eventual support 18 an instrumentation excitation strip line 50, an instrumentation sensing strip line 52, and associated bonding pads 54, 56 for contacting to the electronics. The instrumentation excitation and sensing strip lines 50, 52, which are part of strip transmission lines, should be widely separated to reduce cross talk. The widths of the strip lines 50, 52 may be in the range to 10 to 20 μm for the stated thicknesses of the dielectric layers 26, 30 to act as strip transmission lines with a characteristic impedance of about 50 ohms at microwave frequencies. The bottom metal lithography further leaves an annular excitation electrode 60 surrounding the inner electrode 40 but separated from it and an interconnect 62 to the excitation cross-connect via 48. The annular electrode 60 may have an outer diameter of between 0.1 and 40 μm and an inner diameter of about half of the out diameter. As a result, the gap between the two electrodes 40, 60 is substantially less than the microwave wavelength by at least a factor of ten. However, it is not required that the excitation electrode 60 be an annulus completely and continuously surrounding the sensing electrode 40. Generally, however, improvement is improved if the excitation electrode 60 exists fully or partially in all four quadrants surrounding the sensing electrode 40

The bottom side as illustrated of the chip 22 is further lithographically processed to remove most of the lower dielectric layer 26 on the cantilever 46 between probe tip 14 and the cross-connect vias 48 and the support 18. However, portions underlying the annular excitation electrode 60 and its interconnect 62 are not removed. A thin dielectric pad 64 may be deposited over and around the tip 42 of the sensing electrode 40 to protect it during usage.

The back side of the chip 22 is lithographically etched down to the top metal layer to remove the chip 22 away from the support 18. The resulting cantilever 16 may have a width of between 40 and 200 μm and a length of between 100 and 500 μm. The removal of the chip 22 over the cantilever 16 causes the cantilever 16 to bend as illustrated if the top and middle metal layers 24, 28 have been deposited with different degrees of stress, for example, the top metal layer 24 has more tensile stress than the middle metal layer 28. This allows the probe tip 10 supported on the inclined support to have a support area substantially horizontal to the surface being scanned. The removal of most of the bottom metal layer 32 and the lower dielectric layer 30 further simplifies the interface between the probe tip 10 and the sample 20.

The top metal layer 24 is lithographically etched to define a probe excitation strip line 66 and a probe sensing strip line 68 to connect respectively the sensing cross connect 48 with the sense electrode 42 and the annular excitation electrode 60 with the excitation cross connect 46. The top metal lithography also develops an isolation region 70 between probe strip lines 50, 52 and the upper metal layer 24 beneath the support. The probe strip lines 66, 68 act as signal lines of strip transmission lines similarly to the instrumentation strip lines 50, 52. The top metal layer lithography may be performed immediately after the deposition of the top metal layer 24 onto the silicon chip. The probe excitation and sensing strip lines 66, 68 should be widely separated to reduce cross talk.

The resulting probe assembly 10 has the two strip transmission lines 54, 56 formed in the bottom metal layer 32 on the bottom of the support 18 connected to the two strip transmission lines 66, 68 formed in the top metal layer 24 in the cantilever 16, which in turn are connected to the inner and surrounding annular electrodes 40, 60 at the bottom of end of the cantilever 16.

Figure 6:
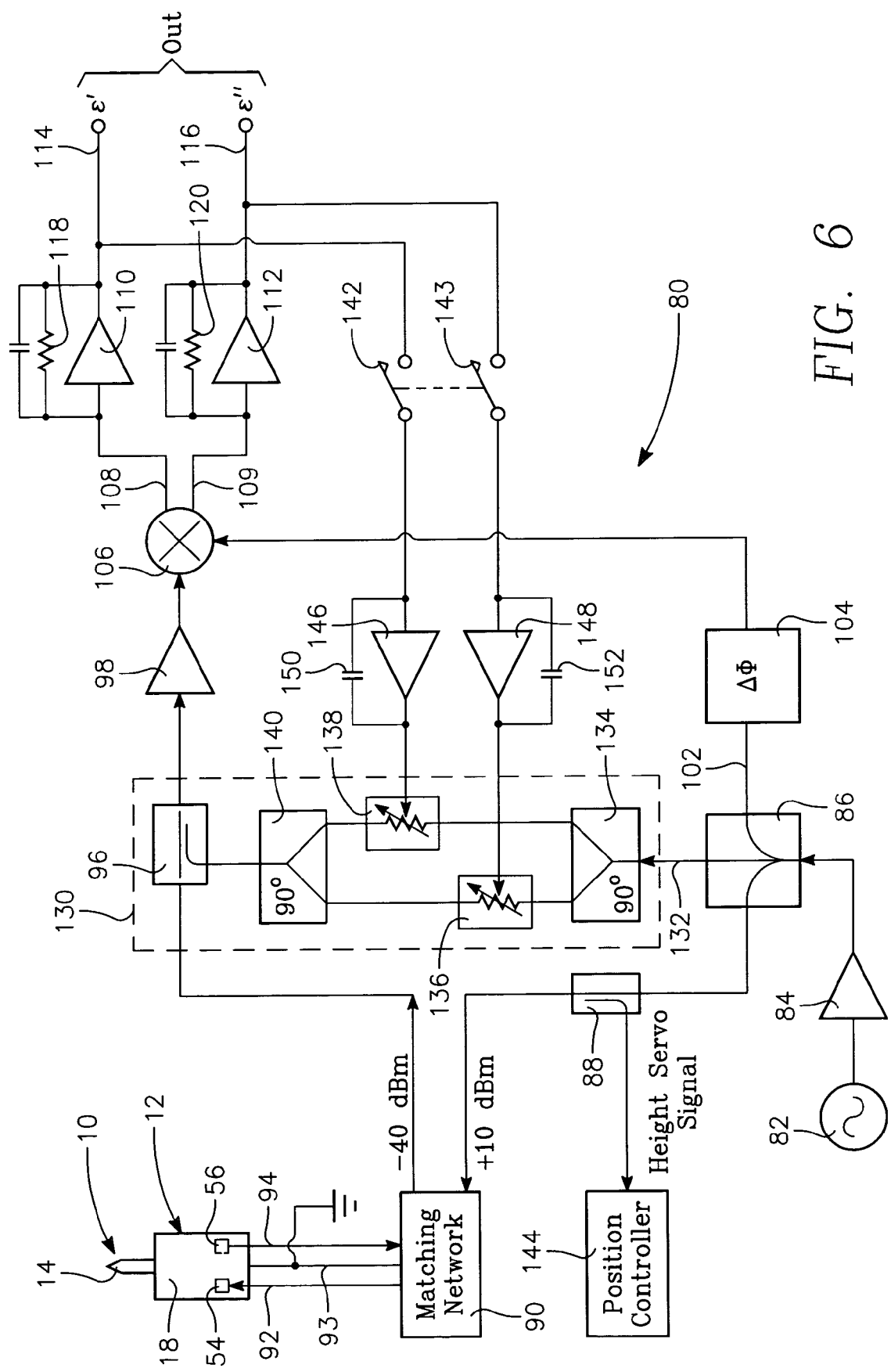
FIG. 6 is a circuit diagram of an example of the circuitry which is connected to the electrical components of the microwave microscope to detect the orthogonal components of the sensed signal.

The probe assembly 12 is electronically connected via the pads 54, 56 to a signal electronics system 80 illustrated in the circuit diagram of FIG. 6. A frequency generator 80 operates in the microwave band, for example, between 100 MHz to 100 GHz although 500 MHz to 5 GHz is a preferred range for simple applications. A frequency of 1 GHz will be used as an example. A microwave amplifier 84 amplifies the output of the frequency generator 82 and applies the signal to a power splitter 86, which divides the microwave power to two and possibly three outputs. One portion, of example, having a power of 10 dBm is directed as an excitation signal to the probe assembly 12. It passes in the reverse direction through a directional coupler 88 to be discussed later and thence to a matching network 90, which converts the characteristic impedance in the signal electronics system 80 to that of the strip transmission lines on the probe 12. An output 92 of the matching circuit 90 is connected to the bonding pad 54 of the instrumentation excitation strip line 50, which eventually connects to the annular excitation electrode 60 of the probe tip 10 to thereby excite the sample 20. A ground line 94 is connected between the ground of the instrumentation and the middle metal layer 28 of the probe assembly 12

An input 94 of the matching network 90 is connected to the bonding pad 56 of the instrumentation excitation strip line 52, which is eventually connected to the sharpened tip 42 of the center electrode 40 to thus provide a sensed signal from the sample 20. The sensed signal may have a power level in the neighborhood of −40 dBm. The sensed signal passes through another directional coupler 96 to be discussed later and a microwave amplifier amplifies the sensed signal to a level closer to that of the excitation signal, for example, by +56 dB.

It is possible to reverse the usage of the electrodes, that is, the center electrode 40 as the excitation electrode and the annular electrode 60 as the sense electrode. While the two modes may be considered similar, it is believed that using the sharpened inner electrode 40 as the sense electrode reduces noise.

A second output 102 of the power splitter 86 is used as a reference signal in a quadrature detection circuitry which allows phase-sensitive detection of the signal from the sensing electrode with respect to an unmodulated microwave signal from the frequency generator 82. A variable phase shifter 104 adjusts the phase of the reference signal to match that of the sensed signal to account for all the phase delays introduced in the signaling and probe circuitry. A quadrature mixer 106 receives both the sensed signal from the amplifier 98 and the reference signal from the phase shifter 106. The mixer 106 non-linearly mixes or multiplies the sensed and reference signals to provide two essentially DC or low-frequency quadrature signals on lines 108, 109 indicative of the real and imaginary parts (in phase and 90° out of phase) of the sensed signal as it varies during the probe scan. The two signal amplitudes are also called orthogonal components of a sinusoidal signal. The quadrature mixer 106 is well known and typically includes two 90° hybrids which split respective ones of the sensed and reference signals into two portions and introduces a 90° phase shift into one of the split portions. Two mixers receive respective pairs of the unshifted and phase-shifted portions to produce the two quadrature signals. Two amplifiers 110, 112 amplify the quadrature outputs of the quadrature mixer 106, for example, by +62 dB, to produce on two output lines 114, 116 two signals $\epsilon'$ and $\epsilon''$ representative of two properties of the sample which are related as real and imaginary parts of a reflected signals produced by a complex excitation signal, for example, dielectric constant and resistivity although the invention is not limited to these two electrical characteristics. Two feedback circuits 118, 120 of parallel capacitive and resistive elements around the two amplifiers 110, 112 control the gain and the frequency response of the amplifiers 110, 112 and prevent them from self-oscillating at high frequency to set the bandwidth and signal level of the two outputs.

The quadrature detection circuitry is very powerful but the invention may utilize other detection circuitry. Amplitude and phase of the sensed signal provide equivalent information and sometimes the amplitude at a given phase is all that is required. In some situations, only the magnitude is needed, that is, the square root of the sums of the squares of $\epsilon'$ and $\epsilon''$, which do not need to be separately determined. In other situations, only one or the other of the quadrature outputs is required, for example, when only dielectric constant or resistivity or layer thickness is being measured.

Microwave microscopes typically suffer from a large difference in the power levels of the excitation and sensed signals, for example, 50 dB in the described embodiment. The large difference introduces a significant common mode problem in which the excitation signal overwhelms the sensed signal. Although the divided excitation and sense electrodes of one aspect of the invention significantly reduces the common mode interference, large portions of the probe 12 and the circuitry 80 have neighboring elements carrying excitation and sensed signals of vastly different magnitudes. Some cross talk and interference seems inevitable. Hence, it is desired to provide some common mode cancellation. A common mode cancellation circuit 130 receives a third output 132 of the power splitter 86 as a common mode reference signal. A first 90° hybrid 134 divides the common mode reference signal into two portions and introduces a 90° phase shift into one of the split portions. The split portions pass through respective voltage controlled attenuators 136, 138 before being recombined in a second 90° hybrid 140, which combines the two split portions with the opposite 90° phase shift. As a result, the two phases of the common mode reference signal are separately and selectively attenuated. The second directional coupler 96 combines the so selectively attenuated common mode reference signal with the unamplified sensed signal from the probe 10.

An intent is that the selectively attenuated common mode reference signal cancels any common mode signal in the sensed signal. Such a result can be accomplished by additional circuitry including two switches 142, 143 connected between the output lines 114, 116, and two sample and hold (S/H) amplifiers 146, 148 having outputs controlling the two voltage control attenuators 136 138 and having associated feedback capacitive elements 150, 152 to limit oscillations. During set up, the probe tip 14 is positioned at a reference position relatively far away from the sample 20 and insensitive to the local variations in the sample 20. The switches 142, 143 are closed to set up a feedback loop which operates to adjust the voltage controlled attenuators 136, 138 and the resultant fed back signal acts to cancel any sensed signal during the set up phase. After an adequate period for equilibration, the sample-and-hold amplifiers 146, 148 are locked and the switches 142, 143 are opened to put the detection circuitry into an open loop which detects only subsequent changes in the sensed signal during the scan mode. Thereby, the common mode cancellation may be used to prevent the amplifier 98 and mixer 106 from being saturated.

The use of separate excitation and sense electrodes and the addition of the common mode cancellation circuitry 130 greatly reduces the maximum signal levels in the mixer 106 and its pre-amplifier 98 so that more gain can be used in the pre-amplfier 98, reducing mixer noise in the detected signal.

The directional coupler 88 on the input to the probe provides at least two advantages. As the probe 12 is scanned over the sample, the sample 20 reflects back a significant signal back to the exciting electrode 60 and through the power splitter 86 to the reference and common mode cancellation portions of the detection circuitry. The directional coupler 88 instead diverts the reflected excitation signal away from the power splitter 86. Further, the reflected signal can be used as a measure of the height of the probe tip 14 from the surface of the sample 10. For example, when the probe tip 10 is being lowered toward the sample 20 prior to lateral scanning, the reflected and diverted signal indicates when a desired height has been reached. The nulling of the common mode cancellation circuit 130 may be performed when the desired height is attained. Alternatively, the reflected signal can be used as a servo signal to maintain the probe tip 10 at a moderately fixed height above an undulating surface of the sample 20 being laterally scanned.

Figure 7:
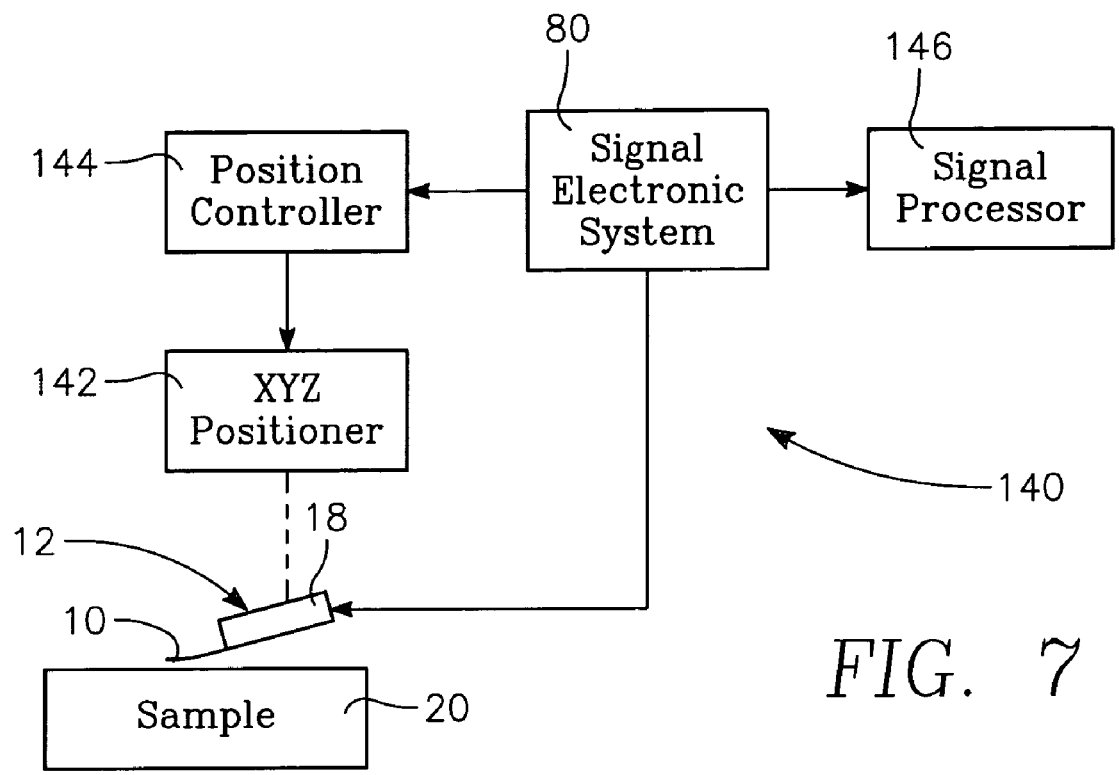
FIG. 7 is a schematic illustration of a microwave microscope system.

A microscope system 140 schematically illustrated in FIG. 7 includes an XYZ mechanical scanning stage 142 which is fixed to the support 18 and under directions from a position controller 144 determines the position and movement of the probe tip 14 adjacent the test sample 20. The z-motion is used to approach the probe tip 10 to the sample 20 and the x- and y-motions are used to scan the probe tip 10 over the surface of the sample 20. The probe tip may contact the sample 20 if the sharpened tip 42 is protected. However, the probe tip may be operated close to but separated from the sample 20. Alternatively to the XYZ mechanical scanning stage 142, one of more degrees of translation may be incorporated into a movable stage supporting the sample 20. The excitation and sense transmission lines connect the excitation and sensing electrodes 42, 58 in the probe 10 to the signal electronics system 80. A signal processor 146 samples the quadrature output signals from the signal electronics system 80 and may calculate one or more electrical characterizations, such as resistivity and dielectric constant from the quadrature output signals. One- and two-dimensional images of these quantities may be obtained as the probe 10 is scanned over the surface of the sample 20.

The described microwave microscope system has the ability to be operated according to different modes of speed and resolution. For example, the probe tip 10 can be positioned a substantial distance above the sample 20 and scanned at a relatively high rate. The spatial resolution is determined by the probe height and may be considerably less than the achievable resolution. However, in this mode the probe 12 may be scanned at a relatively high speed commensurate with the reduced resolution. That is, a first scan is both rough and fast, and may be used for an initial inspection of the sample, for example, determining chip boundaries, substrate, typography, or gross imperfections. Thereafter, the probe tip 10 may be lowered to be closer to the surface of the sample 20 at a position of interest determined by the first scan. At the lower position, the resolution of the microscope is increased, possibly to the degree determined by the size of the tip 42 of the sensing electrode 40. However, in the latter mode, scanning is done at a slower rate though with higher resolution, that is, the scan is both fine and slow.

Many features of the microwave microscope are described in more detail by one of the inventors Zhengyu Wang in *Evanescent Microwave Probe: Applications and Implications*, Stanford University PhD thesis 3781 2004, [Jun. 2] 2004.

Figure 8:
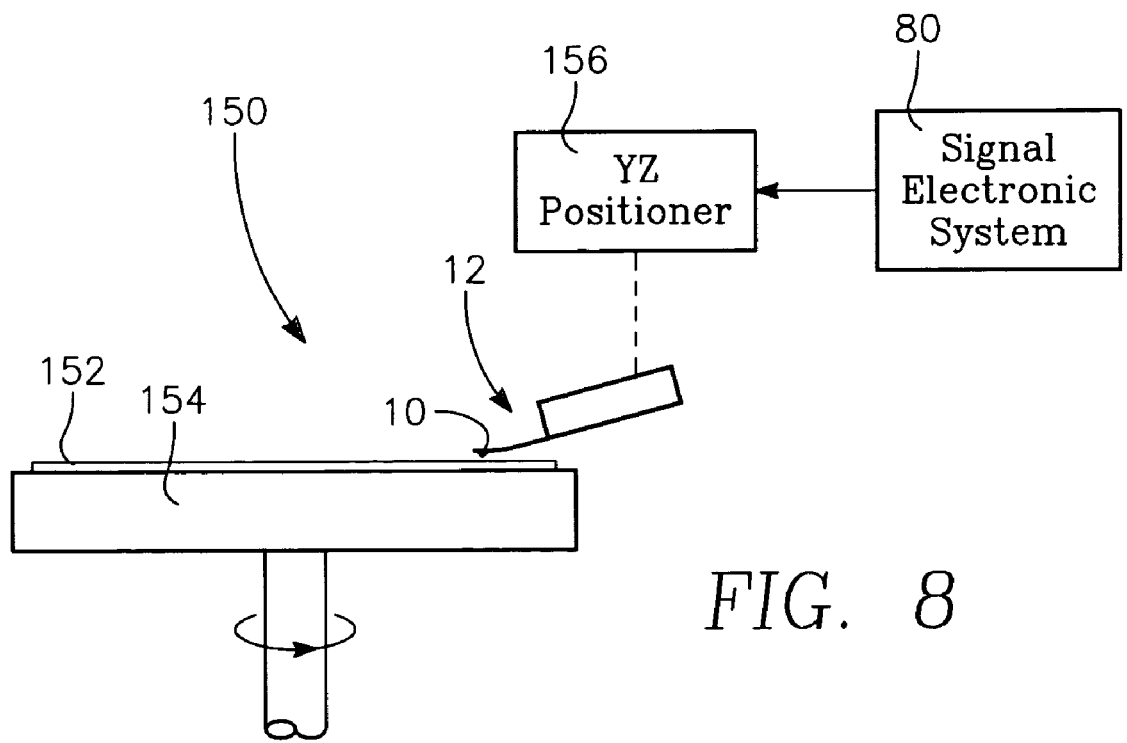
FIG. 8 is a schematic illustration of part of a read head system for reading a recorded disk.

Another embodiment of the invention includes a microwave disk reading system 150, schematically illustrated in FIG. 8. A disk 152 having data recorded in a spiral track is loaded onto a platen 154 that rotates about a center of the disk 152 at a predetermined, typically constant, rotation rate. A YZ positioner 156 moves the probe tip 10 in the z-direction to be adjacent to the disk 154, at which point the probe tip 10 flies along the tracks in the local x-direction, as is well known for optical and magnetic recorded disks. The y-motion in a direction transverse to the tracks is used to keep the probe tip 10 on the spiral track or to move the probe tip 10 to a different band of the disk 152. The probe 10 includes separate excitation and sensing electrodes. The electronics may be adapted from the signal electronics system 80 but may be simpler since orthogonal signals are not always necessary for detecting the data pattern. The reflected excitation signal from the input directional coupler 88 or the orthogonal signals $\epsilon'$ and $\epsilon''$ may be used in part to control the YZ positioner 156 to maintain the probe tip 10 in the middle of the recorded track.

The disk may be recorded with information that is readable by the microwave probe and electronic control system. For example, a conventional optical CD has a track that is burned into a dielectric layer. The burned area is either free space or filled with another material having a different dielectric constant. Hence, the microwave sensor system 150 of FIG. 8 can detect the difference in dielectric constant along the track. As a result, the disk 152 becomes the sample 20 of the previously described microscope embodiments.

Figure 9:
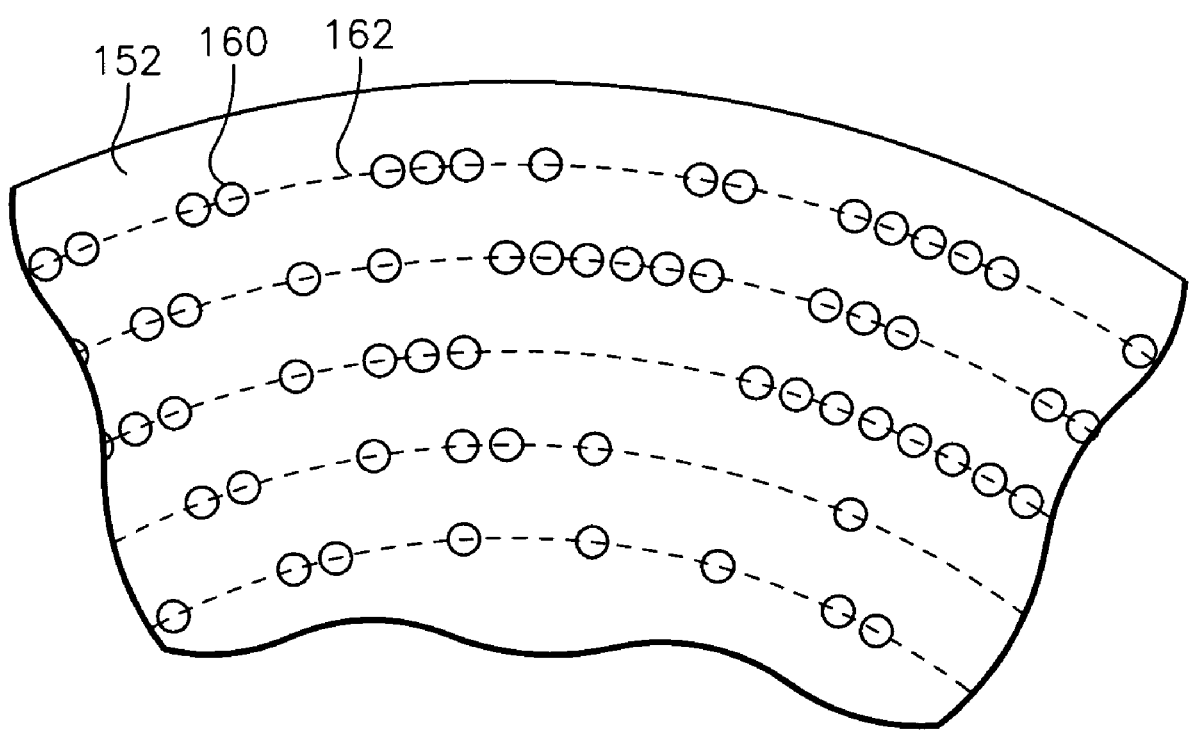
FIG. 9 is plan view of the disk of FIG. 8 formed with ferroelectric islands.

However, recording density can be greatly increased by forming, as illustrated in the plan view of FIG. 9, islands 160 of distinctive material at the top surface of the disk 152, which are arranged in a spiral track 162 in a pattern corresponding to recorded data. The islands 160 may be separated in a return-to-zero (RZ) data arrangement or contiguous islands 160 may joined into elongated islands in a non-RZ (NRZ) arrangement. The islands 160 may be formed of ferroelectric material having a high dielectric constant at microwave frequencies, such as lead zirconium titanate (PZT), over a polymeric disk exhibiting a much lower dielectric constant or even over a metal covered disk. The microwave microscope can detect with high resolution corresponding to the sensing electrode radius the areas of high dielectric constant over a base surface of lower dielectric constant or over a metal and non-dielectric surface. Such islands 160 may be formed by causing a localized phase change in a ferroelectrical layer using a thermal or electrical stimulus, thereby altering the dielectric constant in the stimulated area. Alternatively, the islands 160 may be formed of metal such as aluminum or chromium deposited on a dielectric layer such as polymer.

The microwave microscope and the associated probe have several advantages over prior art microwave microscopes. The stimulating and the sensing electrode are two separated electrodes, which prevents a large common mode signal from being collected and possibly saturate the detector. By reducing the common mode signal, the amplifying capability of the amplifiers can be more fully utilized. By using a probe with inherent common mode cancellation instead of a common mode cancellation circuitry, shot noise can be largely avoided. The MEMS fabrication provides fine resolution in a low-cost probe.

The invention claimed is:

1. A microwave probe system for characterizing a body, comprising:
   a probe having a first electrode and a second electrode electrically isolated from said first electrode within said probe, both of the first and second electrodes being positionable adjacent a surface of said body to be characterized and being scannable along said surface;
   a source outputting a microwave signal to the first electrode, which is an excitation electrode, but not to the second electrode; and
   a signal processing system receiving from the second electrode, which is a sensing electrode, but not from the first electrode, a sensed signal originating from said body in response to an exciting signal from the excitation electrode.

2. The system of claim 1, wherein said microwave signal has a frequency within a range of 100 MHz to 100 GHz.

3. The system of claim 1, further comprising a grounded electrode layer capacitively coupled to electrical lines formed in a metal layer and extending to and from said exciting and sensing electrodes, said grounded electrode layer providing a grounding plane for transmission lines formed thereby.

4. The system of claim 1, wherein said excitation electrode fully or partially surrounds said sensing electrode.

5. The system of claim 4, wherein said sensing electrode has a tip with a radius of less than 10 microns.

6. The system of claim 1, further comprising a cancellation circuit including at least one variable attenuator receiving an unmodulated signal from said source and a coupler receiving outputs of said at least one variable attenuator and an output of the sensing electrode, whereby a signal induced on the sensing electrode with no body present is nulled.

7. The system of claim 1, wherein a reflected signal on said excitation electrode is used to position said probe in vertical direction with respect to said body.

8. The system of claim 1, wherein a portion of the exciting signal reflected from the body back to the excitation electrode is used to position said probe in a vertical direction with respect to said body.

9. The system of claim 1 further comprising a mechanical positioner for positioning said probe in three orthogonal dimensions with respect to said body.

10. The system of claim 1, wherein the probe and the electrodes are lithographically fabricated.

11. The system of claim 1, further comprising pairs of transmission strip lines connected to respective ones of the electrodes.

12. The system of claim 1, wherein the distance between said probe and said surface of said body can be adjusted during a scan in order to scan on different distance scales and at different scan speeds.

13. The system of claim 1, wherein said signal processing system includes a phase-sensitive detecting circuitry which compares said sensed signal to an unmodulated signal from said source.

14. A microwave probe system, comprising:
    a source of microwave radiation;
    a probe tip comprising a central electrode and a surrounding outer electrode, both of which are positionable adjacent a sample and are scannable along a surface of said sample, a first but not a second of said electrodes receiving said microwave radiation as an excitation signal; and
    a detection circuit receiving a sensed signal from the second but not from the first of said electrodes and providing at least one signal indicative of one or more characteristics of said sample.

15. The system of claim 14, wherein said detection circuit additionally receives a reference signal from the source of microwave radiation and combines it with said sense signal to produce two signals indicative of two characteristics of said sample.

16. The system of claim 15, wherein said outer electrode receives said excitation signal and said inner electrode provides said sensed signal and has a radius of between 50 and 500 nm.

17. A microwave probe system for characterizing a body, comprising:
    a probe having an excitation electrode arranged in an annular pattern around and electrically isolated from a sensing electrode within the probe, both of the excitation and sensing electrodes being positionable adjacent to and scannable along a surface of the body to be characterized;
    a source outputting a microwave signal to the excitation electrode to emit an exciting signal to excite the body; and
    a signal processing system receiving from the sensing electrode a sensed signal originating from said body in response to the exciting signal.

18. The system of claim 17, wherein the sensing electrode has a tip with a radius of less than 10 microns.

19. The system of claim 17, wherein the source does not output the microwave signal to the sensing electrode and wherein the signal processing system does not receive the sensed signal from the excitation electrode.

* * * * *

UNITED STATES PATENT AND TRADEMARK OFFICE
CERTIFICATE OF CORRECTION

| | | |
|---|---|---|
| PATENT NO. | : 7,190,175 B1 | Page 1 of 1 |
| APPLICATION NO. | : 11/139759 | |
| DATED | : March 13, 2007 | |
| INVENTOR(S) | : Kelly et al. | |

It is certified that error appears in the above-identified patent and that said Letters Patent is hereby corrected as shown below:

Col. 1, line 4 should read as follows:

-- FEDERALLY-SPONSORED RESEARCH OR DEVELOPMENT

This invention was made with Government support under contract DE-CA03-76SF00515 awarded by the Department of Energy. The Government has certain rights in this invention. --

Signed and Sealed this
Ninth Day of August, 2011

David J. Kappos
*Director of the United States Patent and Trademark Office*